United States Patent
Saito et al.

(10) Patent No.: US 9,076,795 B1
(45) Date of Patent: Jul. 7, 2015

(54) SEMICONDUCTOR DEVICE AND METHOD OF MANUFACTURING THE SAME

(71) Applicant: KABUSHIKI KAISHA TOSHIBA, Minato-ku, Tokyo (JP)

(72) Inventors: Tatsuro Saito, Yokkaichi Mie (JP); Makoto Wada, Yokkaichi Mie (JP); Atsunobu Isobayashi, Yokkaichi Mie (JP); Akihiro Kajita, Yokkaichi Mie (JP); Tadashi Sakai, Yokohama Kanagawa (JP)

(73) Assignee: KABUSHIKI KAISHA TOSHIBA, Tokyo (JP)

(*) Notice: Subject to any disclaimer, the term of this patent is extended or adjusted under 35 U.S.C. 154(b) by 0 days.

(21) Appl. No.: 14/478,996

(22) Filed: Sep. 5, 2014

(30) Foreign Application Priority Data

Jan. 23, 2014 (JP) ................................ 2014-010252

(51) Int. Cl.
| | | |
|---|---|---|
| H01L 23/52 | (2006.01) | |
| H01L 23/532 | (2006.01) | |
| H01L 21/768 | (2006.01) | |
| H01L 23/528 | (2006.01) | |
| H01L 23/522 | (2006.01) | |

(52) U.S. Cl.
CPC .... *H01L 23/53276* (2013.01); *H01L 21/76876* (2013.01); *H01L 23/528* (2013.01); *H01L 23/5226* (2013.01)

(58) Field of Classification Search
CPC ...................... H01L 23/53276; H01L 23/5226; H01L 23/528; H01L 21/76876
See application file for complete search history.

(56) References Cited

U.S. PATENT DOCUMENTS

| | | | |
|---|---|---|---|
| 8,358,008 B2 | 1/2013 | Wada et al. | |
| 8,378,335 B2 | 2/2013 | Yamazaki et al. | |
| 8,524,525 B2 | 9/2013 | Lemieux et al. | |
| 2011/0143045 A1 | 6/2011 | Veerasamy | |
| 2011/0233779 A1 | 9/2011 | Wada et al. | |
| 2012/0080796 A1* | 4/2012 | Wada et al. .................. 257/762 |
| 2013/0134592 A1 | 5/2013 | Yamazaki et al. | |

FOREIGN PATENT DOCUMENTS

JP          5395542 B2      1/2014

OTHER PUBLICATIONS

U.S. Appl. No. 14/202,683, First Named Inventor: Tatsuro Saito, Title: "Semiconductor Device and Method of Manufacturing the Same", Filed: Mar. 10, 2014.

* cited by examiner

*Primary Examiner* — Roy Potter
*Assistant Examiner* — Paul Patton
(74) *Attorney, Agent, or Firm* — Holtz, Holtz, Goodman & Chick PC (57) ABSTRACT

According to one embodiment, there is provided a semiconductor device using graphene, includes a catalyst layer formed on or in a substrate along with an interconnect pattern and a graphene layer formed on the catalyst layer. The graphene layer is arranged parallel to a narrower linewidth than the width of the interconnect pattern.

20 Claims, 8 Drawing Sheets

SEMICONDUCTOR DEVICE AND METHOD OF MANUFACTURING THE SAME

CROSS-REFERENCE TO RELATED APPLICATIONS

This application is based upon and claims the benefit of priority from Japanese Patent Application No. 2014-010252, filed Jan. 23, 2014, the entire contents of which are incorporated herein by reference.

FIELD

Embodiments described herein relate generally to a semiconductor device using graphene for interconnecting an LSI and a method of manufacturing the same.

BACKGROUND

Recently, a graphene interconnect structure using graphene instead of metal has been attracting attention. Graphene, a novel carbon material in which graphite is made extremely thin, exhibits quantized (ballistic) conduction properties in the same way that a carbon nanotube does.

DETAILED DESCRIPTION

In general, according to one embodiment, there is provided a semiconductor device using graphene, comprising a catalyst layer formed on or in a substrate along with an interconnect pattern and a graphene layer formed on the catalyst layer. The graphene layer is arranged parallel to a narrower linewidth than the width of the interconnect pattern.

Since graphene exhibits quantized conduction properties as mentioned above, it can be used as an interconnect having ultimately low resistance instead of a metallic interconnect and is advantageous with respect to electrical conduction in a long-distance interconnect. Also, graphene has excellent consistency for a process of forming a device interconnect, since the structure of graphene itself is an extremely thin film and graphene can be formed by a CVD method.

In an interconnect structure using graphene, while it is possible to realize a lower-resistance interconnect having a narrow linewidth than conventional metal, there is a case where resistance is higher in a wide-linewidth interconnect than conventional metal. Also, it is known that doping other elements is effective as a method for further realizing low resistance in a graphene interconnect structure. However, it is difficult to introduce elements sufficiently into a graphene layer when the width of an interconnect is wide. In a graphene interconnect structure, it is therefore important how doping is carried out when the width of an interconnect is wide.

Figure 6:
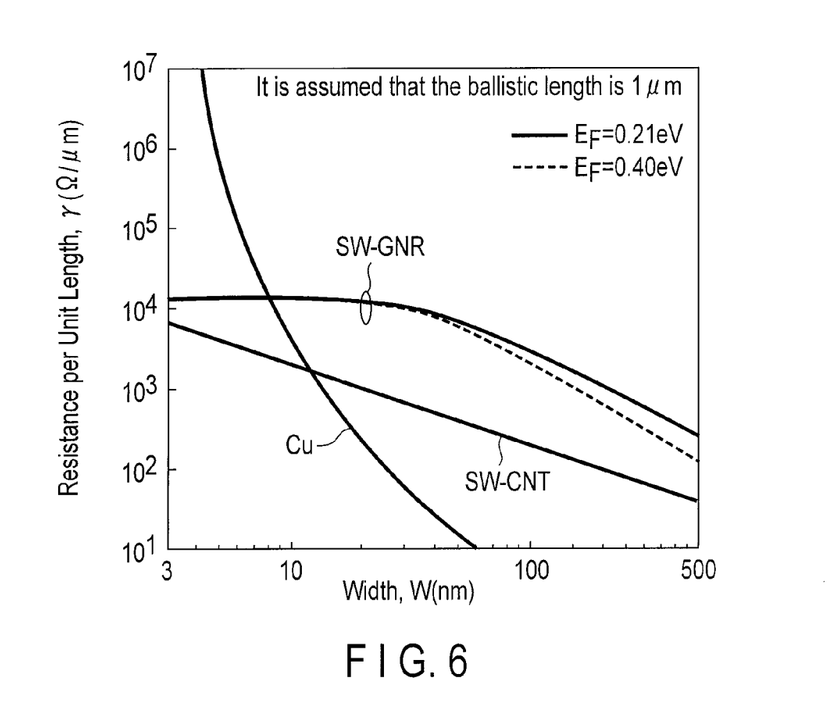
FIG. 6 is a graph illustrating the relationship between interconnect width and resistance of graphene.

As shown in FIG. 6, the resistance of Cu, which is normal interconnect metal, increases as the interconnect becomes narrower, while the resistance of graphene does not. Note in the figure that "SW-GNR" refers to a single-layer graphene and "SW-CNT" a single-layer carbon nanotube.

That is, the resistance remains almost constant in a fine interconnect width as a result of the quantum effect, regardless of linewidth. Also, the resistance of graphene is by far lower than that of Cu in a region having a width of approximately 10 nm or less because of quantized conduction properties. This reveals that the graphene is effective in a narrow-linewidth interconnect and not effective in a wide-linewidth interconnect.

The purpose of the present embodiment is to reduce interconnect resistance by separating graphene into a plurality of pieces having a narrow linewidth. That is, although by separating graphene into a plurality of pieces having a width of tens of nm, the resistance of each piece of graphene gets slightly higher than that of graphene having the original width, the total resistance of the plurality of pieces gets substantially lower than that of graphene having the original width by connecting a plurality of pieces in parallel. The purpose of the present embodiment is to thereby reduce the resistance of a graphene interconnect.

Semiconductor devices according to embodiments will be hereinafter described with reference to the accompanying drawings.

First Embodiment

Figure 1:
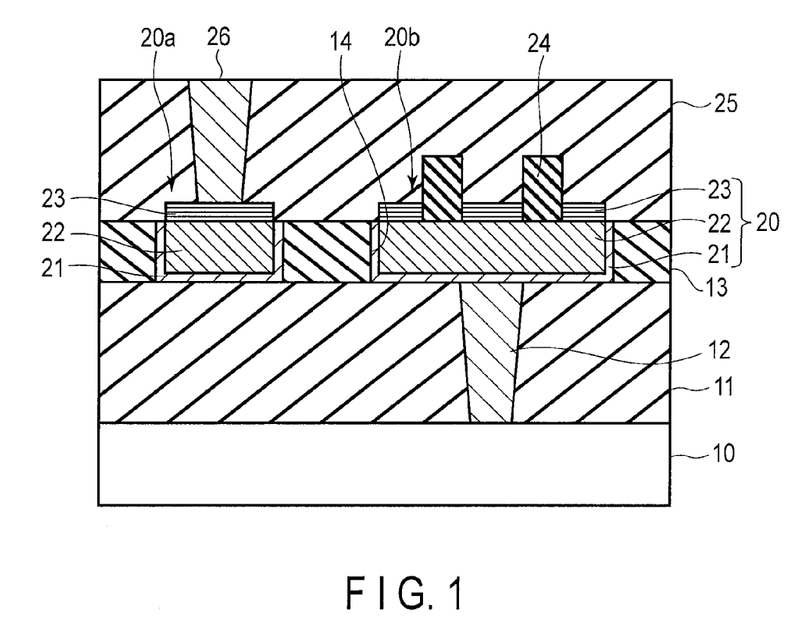
FIG. 1 is a cross-sectional view illustrating the schematic structure of a semiconductor device according to a first embodiment.

FIG. 1 is a cross-sectional view illustrating the schematic structure of a semiconductor device according to a first embodiment.

A plurality of interconnect layers 20 are formed on a substrate. A part of the interconnect layers 20 are connected to a lower semiconductor element and an upper interconnect layer through a contact via. The first embodiment has a novel LSI interconnect structure using graphene to the material of the interconnect layers 20 and is characterized in that graphene is separated particularly in a wide-width interconnect. In the following, a detailed description will be given.

A first contact layer insulating film 11 is formed on a Si substrate 10, on which semiconductor elements such as transistor and capacitor are formed. A lower contact via 12, which is configured to connect a lower-layer semiconductor element and an upper-layer interconnect layer, is embedded and formed in the insulating film 11. An interconnect layer insulating film 13 is formed on the insulating film 11, on which the contact via 12 is formed. A plurality of interconnect grooves 14 are formed in the insulating film 13.

The structure of forming the contact layer insulating film 11 and the contact via 12 on the Si substrate 10 is defined as a substrate. Also, it is possible to define a substrate including the interconnect layer insulating film 13 on the contact layer insulating film 11.

A catalyst underlayer 21, which is configured to promote uniform growth of a graphene layer, is formed on the bottom face and the side face of the interconnect grooves 14. Further, a metallic catalyst layer 22, which is configured to grow a graphene layer, is formed on the catalyst layer 21 so as to embed the interconnect grooves 14. A graphene layer 23, which functions as an electrically conductive layer, is formed on the metallic catalyst layer 22. The interconnect layers 20 consist of the catalyst underlayer 21, the metallic catalyst layer 22 and the graphene layer 23.

The graphene layer 23 is formed on the whole surface of the catalyst layer 22 in an interconnect layer 20a, which has a narrow linewidth (for example, 10 nm or less). The graphene layer 23 is separated into a plurality of layers in an interconnect layer 20b, which has a wide linewidth. That is, a graphene separation layer 24 is formed on the catalyst layer 22 to separate the graphene layer 23 to a width of, for example, 10 nm or less. Note that while the interconnect layer 20b is connected to the contact via 12 in FIG. 1, it may also be possible that the interconnect layer 20a is connected to the contact via 12.

Note that a graphene layer is a layer where a plurality of graphene sheets are laminated in a direction non-parallel to the surface of a substrate. In FIG. 1, a plurality of graphene sheets are laminated in a vertical direction to the surface of the metallic catalyst layer 22. Such graphene layers are arranged side by side in a parallel direction to the surface of the metallic catalyst layer 22.

A second contact layer insulating film 25 is formed on the interconnect layer insulating film 13, on which the interconnect layers 20 are formed. A contact via 26 is embedded and formed in the insulating film 25. The contact via 26 is configured to contact the graphene layer 23 of the interconnect layer 20a. Note that the contact via 26 may be formed so as to contact the interconnect layer 20b.

The catalyst underlayer 21 is an auxiliary film for promoting uniform growth of the graphene layer 23. Also, the catalyst underlayer 21 plays a role in preventing diffusion into the insulating film and the underlayer contact from the metallic catalyst layer 22. The typical materials of the catalyst underlayer 21 include Ta, Ti, Ru, W and Al. Also, it is possible to use the nitride and oxide of these films and a laminating material containing these films.

The metallic catalyst layer 22 is a layer necessary for growing graphene. It is preferable that any of single metals, Co, Ni, Fe, Ru and Cu is used for the material of the metallic catalyst layer 22. It is also preferable that alloy containing at least any of them or carbide of them is used for the material of the metallic catalyst layer 22. It is desirable that the catalyst layer 22 of graphene be a continuous film. It is therefore necessary that the catalyst layer 22 be formed to have a thickness of at least 0.5 nm to be a continuous film. Graphene itself cannot grow well in a state where the catalyst layer 22 is diffused and microparticulated. Further graphene layer might be formed in discontinuity. Accordingly, it is necessary that the catalyst 22 be formed to have a thickness enough to be a continuous film, in order to form uniform continuous graphene layers.

The graphene layer 23 is a layer on which novel carbon materials having extremely thin graphite are laminated. Also, the graphene layer 23 can be used instead of a metallic interconnect to realize an interconnect having ultimately low resistance as a result of quantized conduction. In the structure of the first embodiment, graphene functioning as an electrically conductive layer is formed as a laminated layer.

The graphene separation layer 24 is formed so as to form a plural pieces of graphene narrower than an interconnect width in a longitudinal direction of the interconnect. The materials of the graphene separation layer 24 include a hardmask material and inhibit graphene growth on the surface of the separation layer 24. For example, it is possible to use Ta, Ti, Ru, W, Al, Si and the like, and nitride or oxide of material thereof. A low-resistance material can be used for the separation layer 24 to use it as a part of the electrically conductive layer. Further, a material that functions as dopant can be used to dope other elements into graphene.

It is also possible that a diffusion barrier layer (not shown) such as SiN is formed so as to cover the above-mentioned interconnect structure.

In such a structure, it is possible to reduce an interconnect resistance by finely separating and forming the graphene layer 23, even when the interconnect layer has a wide width. Also, such a structure allows chemical elements to be easily introduced to each of the separated graphene layers, which further reduces resistance of the graphene layer.

That is, the structure in the first embodiment is the same as a conventional graphene interconnect structure when the linewidth is narrow, and narrow-width graphene is formed in parallel when the linewidth is wide. This realizes a graphene interconnect structure suitable for doping while exploiting the quantized conduction of graphene. Therefore, it is possible to reduce interconnect resistance and contribute to improving the performance of a semiconductor device. With a wide-width interconnect, it is also possible to increase the ratio of sidewalls by forming a narrow-width graphene in parallel as an electrically conductive layer. It is thereby possible to easily dope other elements into the graphene.

Second Embodiment

Next, a method of manufacturing the semiconductor device of the first embodiment will be described as a second embodiment.

FIGS. 2A to 2E are cross-sectional views illustrating the process of manufacturing the semiconductor device according to the second embodiment. Note that while the position of the contact via is different from that of FIG. 1, it is possible that the position is the same as in FIG. 1.

Figure 2A:
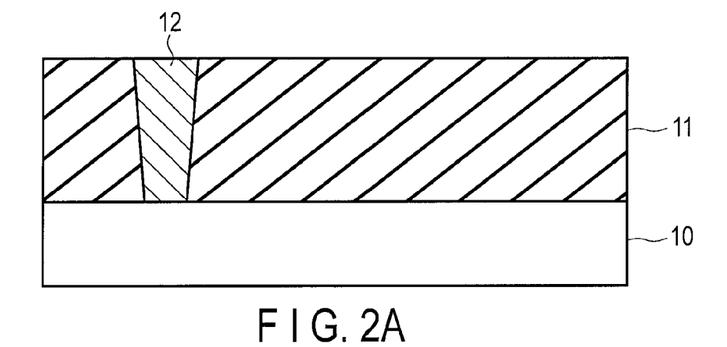
FIGS. 2A to 2E are cross-sectional views illustrating the process of manufacturing a semiconductor device according to a second embodiment.

To begin with, as shown in FIG. 2A, the first contact layer insulating film 11 such as TEOS is formed on the Si substrate 10, on which semiconductor elements such as transistor and capacitor are formed. Also, the lower contact via 12, which is configured to connect the semiconductor element of a lower layer and the interconnect layer of an upper layer, is embedded and formed in the insulating film 11. A single metal such as W, Cu and Al is used for conductive material as the contact via 12.

Figure 2B:
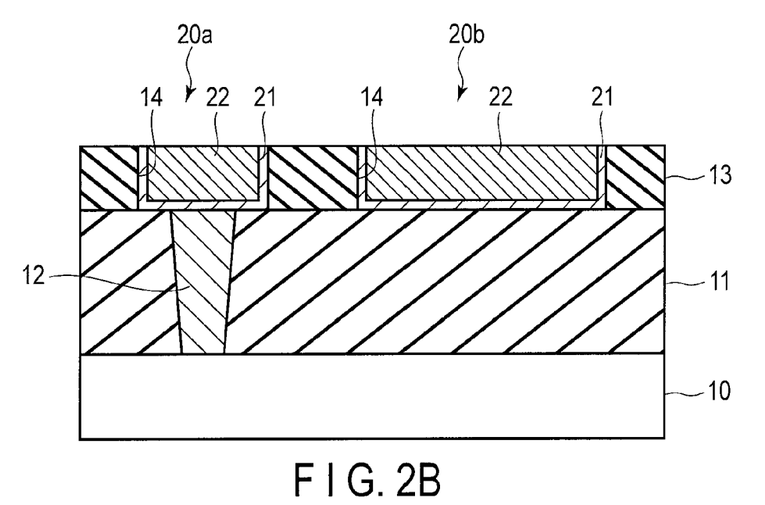

Next, as shown in FIG. 2B, the interconnect layer insulating film 13 such as $SiO_2$ film and SIOC film is formed on the insulating film 11. If a sufficient selection ratio between the contact layer insulating film 11 and the interconnect layer insulating layer 13 cannot be obtained, a stopper layer such as SiCN can be formed on the upper face of the contact layer insulating film 11.

Then, the plurality of interconnect grooves 14, which are configured to form an interconnect layer, are formed in the interconnect layer insulating layer 13 by RIE or the like. The catalyst underlayer 21, which functions as an auxiliary film for facilitating preparation of a graphene layer, is formed on the bottom face and the side face of each of the plurality of interconnect grooves 14. Further, the metallic catalyst layer 22 for growing a graphene layer is formed on the catalyst underlayer 21. Note in the figure that the left side corresponds to the interconnect layer 20a having a narrow linewidth and the right side corresponds to the interconnect layer 20b having a wide linewidth. An underlayer material and a catalyst material are as mentioned above. The surface is then flattened after a CMP process.

Figure 2C:
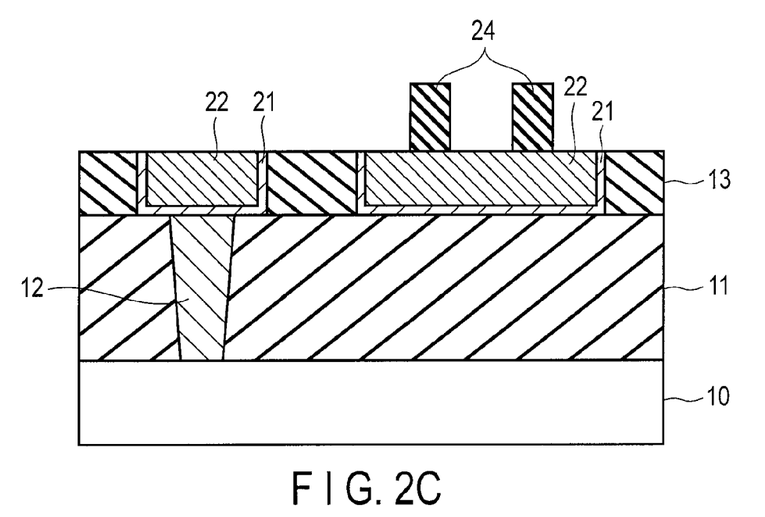

Subsequently, as shown in FIG. 2C, a fine line that functions as the graphene separation layer 24 is formed on a portion that functions as a wide-linewidth interconnect portion. For example, a separation layer material film is formed on the whole surface, and a resist is formed thereon. Then, the plurality of graphene separation layers 24 are formed by photolithography and RIE so that the width of the exposed portion of the metallic catalyst layer 22 is narrower than a predetermined interconnect width. The materials of the separation layer 24 are as described above.

A predetermined interconnect width is defined as follows. When a linewidth is made less than that of a narrow interconnect by dividing a wide-linewidth interconnect, processing is not possible. Therefore, it is necessary to make the width of a divided graphene wider than a processable narrow interconnect width. The width of a wide interconnect is three times wider than that of a narrow interconnect, since at least two pieces of graphene having a width wider than the width of the narrow interconnect need to be arranged. Therefore, a dividable interconnect is an interconnect three times wider than the narrowest interconnect in the same layer. That is, when the smallest width that can be formed by fine processing is 10 nm, a predetermined interconnect width is 30 nm. Note that a predetermined interconnect width can be further reduced when the smallest width decreases.

Figure 2D:
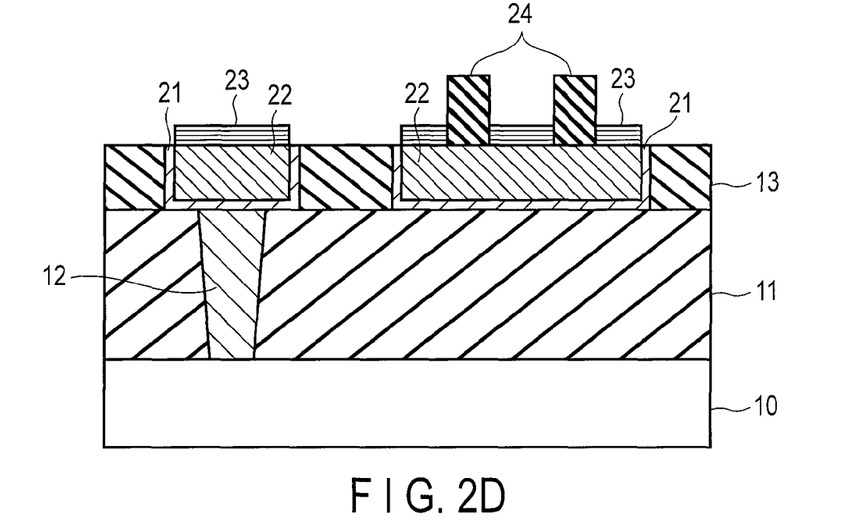

Thereafter, as shown in FIG. 2D, the graphene layer 23, which functions as an electrical conductive layer, is formed. The graphene layer 23 is formed by a CVD method. Hydrocarbon series gas such as methane and acetylene or mixed gas thereof is used for the carbon source of a CVD method, and hydrogen and rare gas are used for carrier gas. The graphene layer 23 has a feature of being formed only on the catalyst layer 22, which is a continuous layer, not on the surface of the graphene separation layer 24.

At this time, it is possible to add gas containing a doping element into material gas for purpose of doping into graphene. It is also possible to perform processing such as anneal under a doping material atmosphere for the same purpose. The elements of groups 14 to 17 are used for doping material; N, Cl, Br and a reactant containing them are used. There is also a case where a metal such as Fe is included.

Figure 2E:
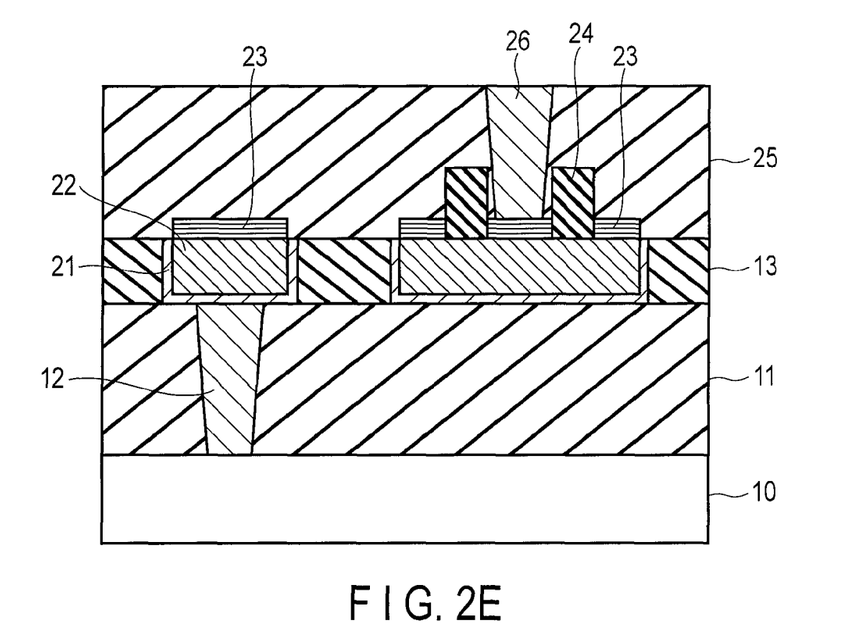

Then, as shown in FIG. 2E, after forming the second contact layer insulating film 25 such as TEOS, the structure substantially the same as that of FIG. 1 is obtained by forming the upper contact layer 26.

Thus, according to the second embodiment, it is possible to form in parallel the plurality of graphene layers having a narrow linewidth in the interconnect layer 20b having a wide linewidth, by forming the graphene separation layer 24 for the interconnect layer 20b having a wide linewidth. It is therefore possible to reduce the resistance of the interconnect layer 20b.

Also, by adding N, Cl, Br and the like, which contribute to reducing resistance of graphene, to material gas in CVD for graphene growth, it is possible to dope these elements to the graphene layer 23. Since doping is conducted for the graphene layer 23 in a lateral direction, it is impossible to dope into the inside effectively when graphene is wide. In the second embodiment, since the width of each of the graphene layers becomes smaller by separating graphene into a plurality of pieces, it is possible to dope into the graphene layer 23 effectively. That is, it is possible to further reduce resistance of graphene by doping.

Third Embodiment

In the third embodiment, the graphene layer 23 is thickened by providing a level difference in the metallic catalyst layer 22.

Figure 3A:
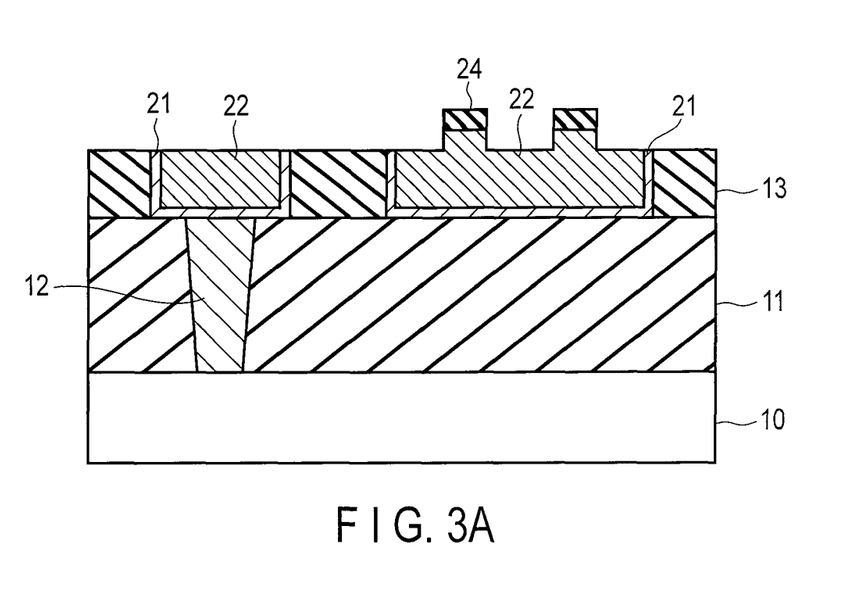
FIGS. 3A and 3B are cross-sectional views illustrating the process of manufacturing a semiconductor device according to a third embodiment.

In the process shown in FIG. 2C, a hard mask (not shown) is used to etch a part of the graphene separation layer 24 and its underlayer, i.e., the metallic catalyst layer 22, as shown in FIG. 3A. That is, by performing over-etching for the metallic catalyst layer 22 after processing the graphene separation layer 24, a level difference having a form of a graphene separation layer is formed on the surface of the catalyst layer 22.

Figure 3B:
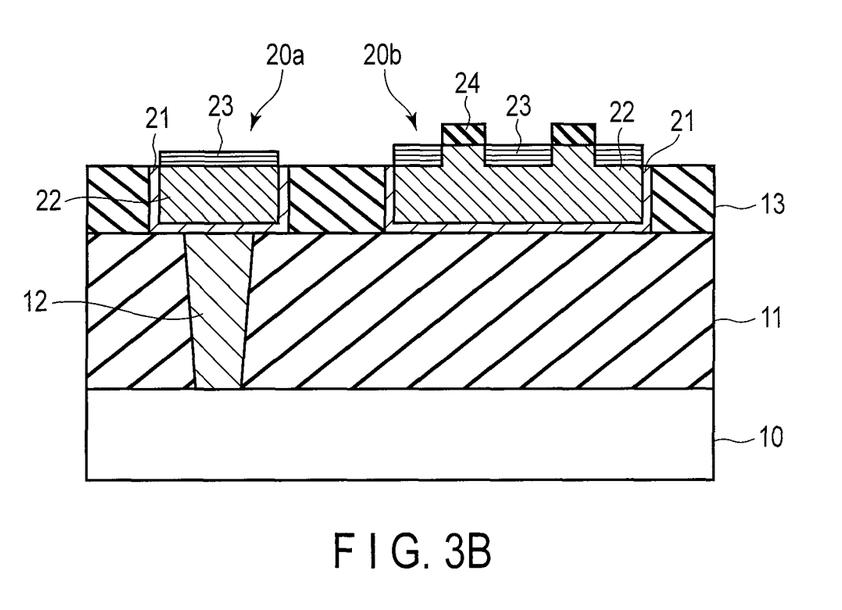

Next, as shown in FIG. 3B, the graphene layer 23 is grown by CVD. Graphene grows so as to embed the level differences in a catalyst. Therefore, it is possible to form graphene according to the height of a level difference. That is, by giving a level difference to the catalyst layer 22 on the interconnect layer 20b, it is possible to thicken the graphene layer 23. It is thereby possible to further reduce resistance of a portion of the interconnect layer 20b.

After forming the graphene layer 23, as with the second embodiment, the contact layer insulating film 25 and the contact via 26 are formed.

Thus, in the third embodiment, it is possible to thicken the graphene layer 23 by giving a level difference to the catalyst layer 22 on the interconnect layer 20b having a wide width. It is therefore possible to further reduce resistance of a portion of the interconnect layer 20b.

Fourth Embodiment

FIGS. 4A to 4F are cross-sectional views illustrating the process of manufacturing a semiconductor device according to a fourth embodiment. Note that the same portions as FIG. 1 are given the same reference numbers to omit the detailed description.

The method of the fourth embodiment is to process a metallic catalyst layer by RIE, not to embed a metallic catalyst layer in an interconnect groove.

Figure 4A:
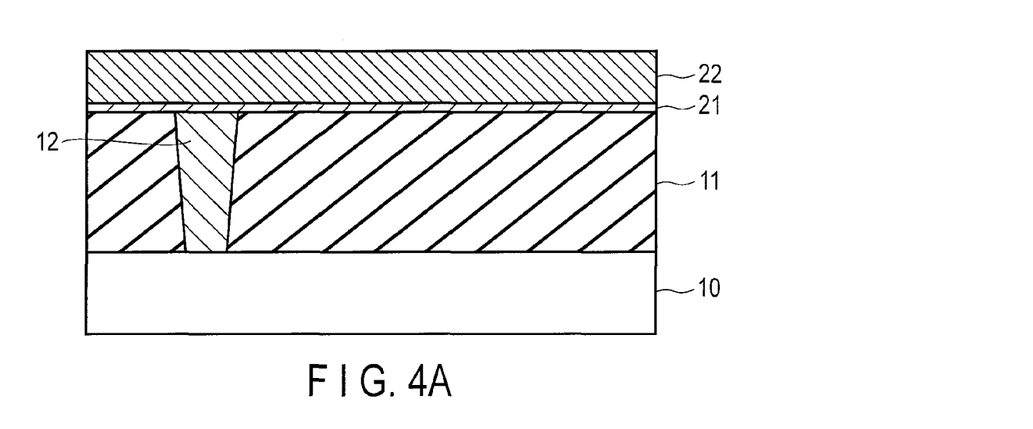
FIGS. 4A to 4F are cross-sectional views illustrating the process of manufacturing a semiconductor device according to a fourth embodiment.

First of all, as with FIG. 2A, the first contact layer insulating film 11 and the lower contact via 12 are formed on the Si substrate 10. The catalyst underlayer 21 and the metallic catalyst layer 22 are then formed on the insulating film 11, as shown in FIG. 4A.

Figure 4B:
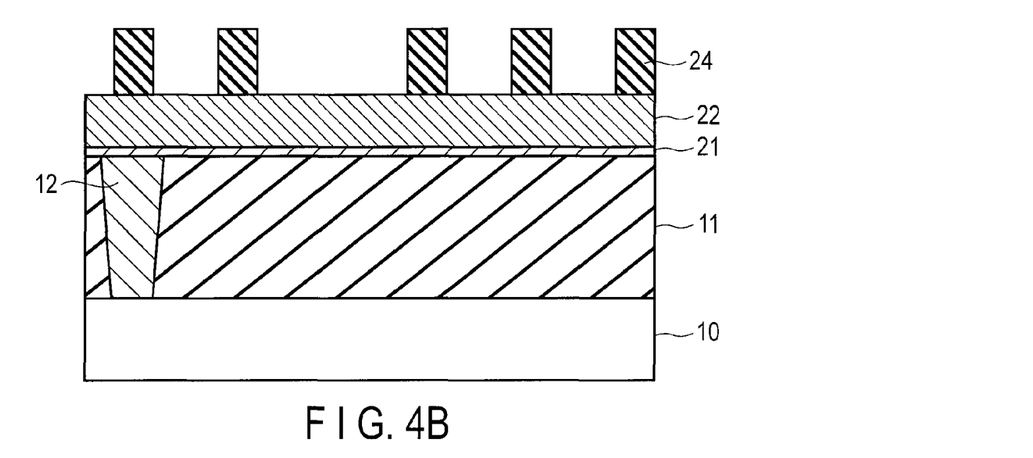

Next, as shown in FIG. 4B, a film that functions as the graphene separation layer 24 is formed on the whole surface of the metallic catalyst layer 22. Then, after the processes of lithography, RIE and the like, the graphene separation layer 24 is formed in a portion that functions as an interconnect portion in a narrow-width interconnect such as cell. Further, in a wide-width interconnect such as sense amplifier, the graphene separation layer 24 is formed in a space, where graphene is not formed, in a region that functions as an interconnect portion.

Figure 4C:
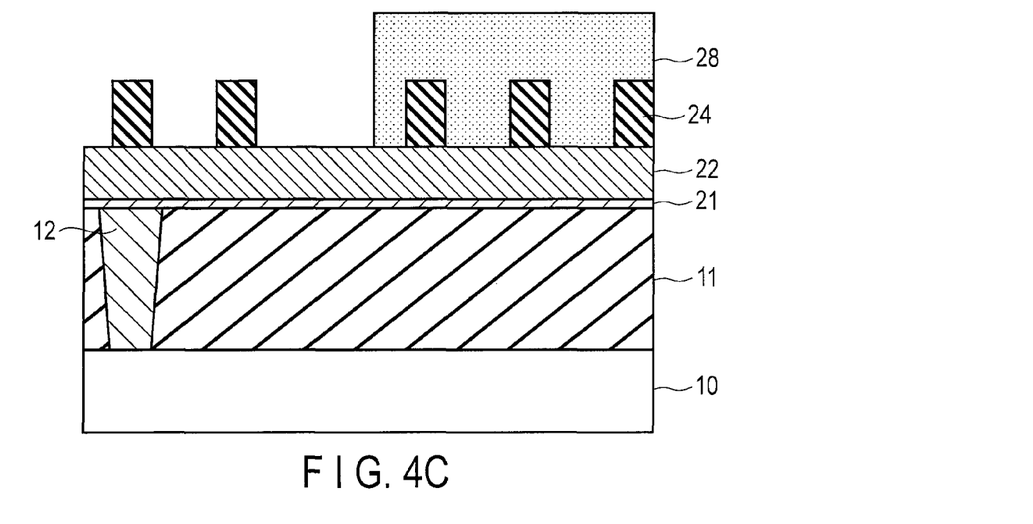

Subsequently, as shown in FIG. 4C, a resist 28 is formed so as to cover only a wide-width interconnect portion to form a wide-width interconnect.

Figure 4D:
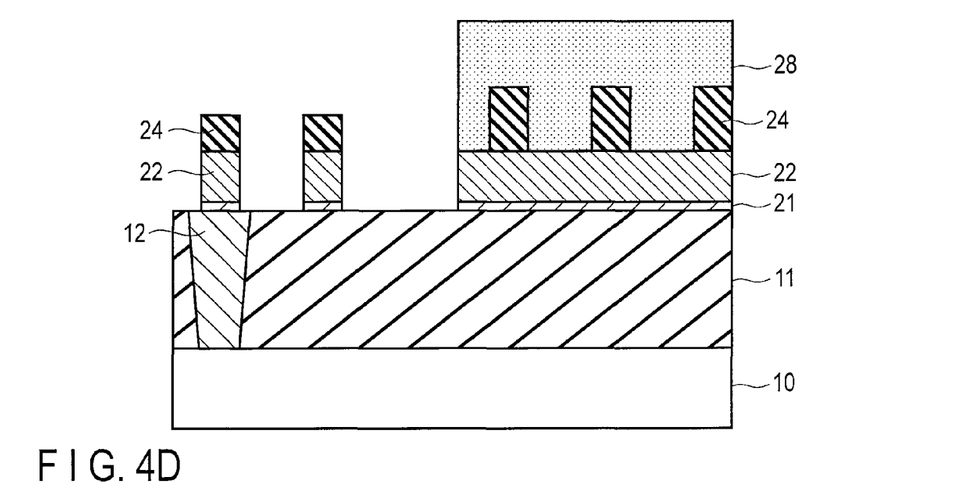

Then, as shown in FIG. 4D, the resist 28 and the separation layer 24 are used for a mask to process the metallic catalyst layer 22 and the catalyst underlayer 21 between an interconnect by RIE. At this time, the metallic catalyst layer 22 and the catalyst underlayer 21 remain only on a portion of the separation layer 24 when the width is narrow, while the metallic catalyst layer 22 and the catalyst underlayer 21 remain only on a portion of the resist 28 when the width is wide.

Figure 4E:
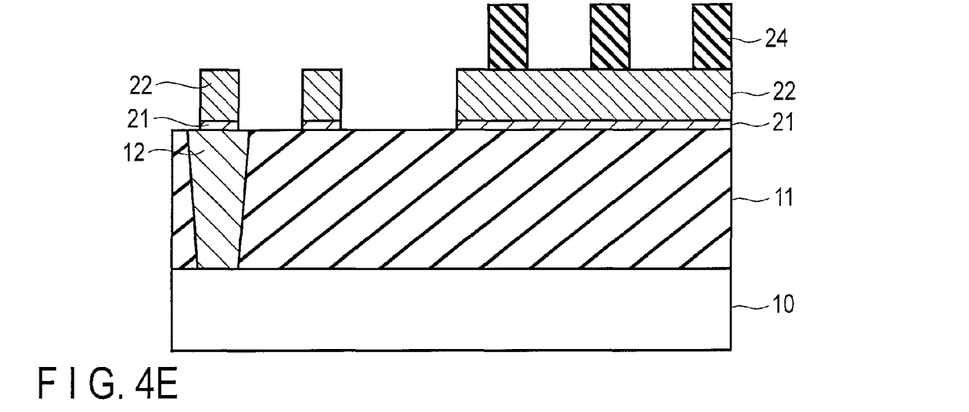

After processing the catalyst layer 22 and the underlayer 21, as shown in FIG. 4E, the separation layer 24 in a narrow-width portion is eliminated and the resist 28 of a wide-width portion is peeling by ashing.

Figure 4F:
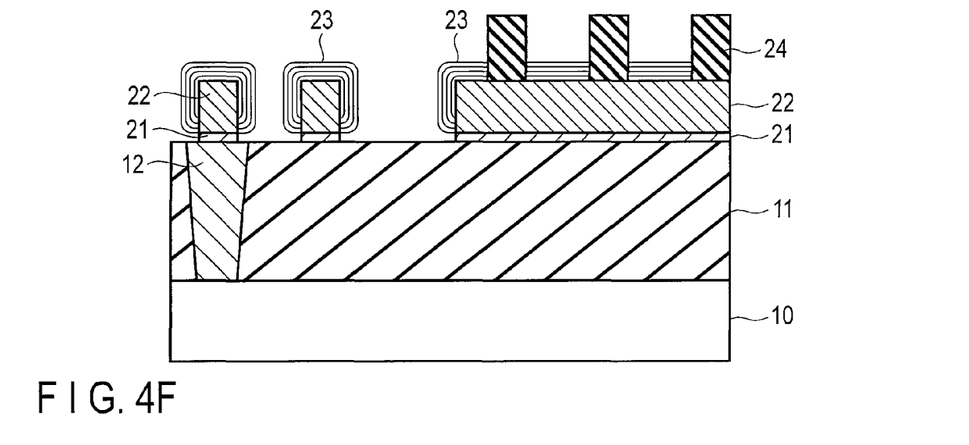

Next, as shown in FIG. 4F, the graphene layer 23 is formed by CVD or the like. At this time, since the side face of the metallic catalyst layer 22 is exposed, graphene is formed on the exposed side as well as the exposed surface of the catalyst layer 22. As with the third embodiment, gas containing a doping element may be added to material gas for purpose of doping into graphene. It is also possible to perform processing such as anneal under a doping material atmosphere after forming graphene for the same purpose.

Thereafter, a second contact layer insulating film, an upper contact via and the like are formed.

According to the fourth embodiment, it is thus possible to obtain the same effect as the first and second embodiments and to form the graphene layer 23 on the side of the catalyst layer 22. Therefore, it is possible to further reduce resistance of an interconnect layer.

Fifth Embodiment

Figure 5:
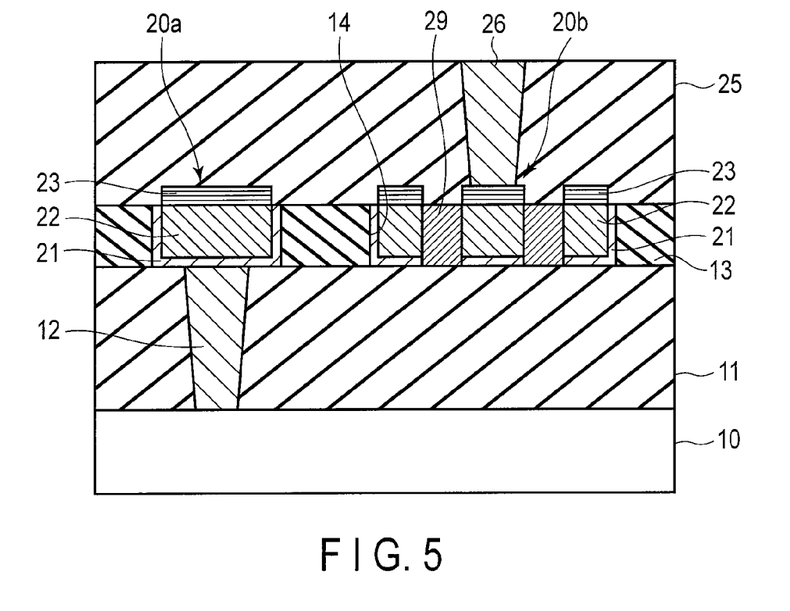
FIG. 5 is a cross-sectional view illustrating the schematic structure of a semiconductor device according to a fifth embodiment.

FIG. 5 is a cross-sectional view illustrating the process of manufacturing a semiconductor device according to a fifth embodiment. Note that the same portions as FIG. 1 are given the same reference numbers to omit the detailed description.

The fifth embodiment is characterized in that a catalyst layer as well as graphene is separated into a plurality of pieces for a wide-width interconnect.

As shown FIG. 5, the metallic catalyst layer 22 is formed to be separated into a plurality of pieces. In this example, after forming the catalyst underlayer 21 on the bottom face and the side face of the interconnect grooves 14 and then embedding and forming the metallic catalyst layer 22, a catalyst separation layer 29 is formed so as to separate the grooves 14. The material of the separation layer 29 may be the same as that of the catalyst underlayer 21. The metallic catalyst layer 22, which is embedded in the interconnect grooves 14, is thereby separated into a plurality of fine lines. Thereafter, graphene grows only on the catalyst layer 22 by forming graphene. Therefore, the graphene layer 23 is separated into fine lines on the interconnect layer 20b.

Note that when the graphene layer 23 is separated into a plurality of pieces, the separated graphene layers function as a single interconnect, if the separation layer 29 is an electrical conductor. Further, if the catalyst underlayer 21 is an electrical conductor, the separated graphene layers function as a single interconnect. Even if both the catalyst underlayer 21 and the separation layer 29 are insulators, in the end portion (one end or both ends) in a longitudinal direction of an interconnect, the separated graphene layers can function as a single interconnect when the metallic catalyst layer 22 is connected.

Also, the same effect can be obtained, if a material that separates the metallic catalyst layer 22 is a material that inhibits growth of graphene, not limited to a material of the catalyst underlayer 21.

Even under such a structure, it is possible to finely separate and form the graphene layer 23 in a wide-width interconnect layer and thereby to reduce interconnect resistance. Therefore, the same effect as the first embodiment can be obtained.

(Example of Deformation)

Note that the present invention is not limited to each of the embodiments described above.

While an chemical element for reducing the resistance of a graphene layer is added to the material gas of CVD in the embodiments, solid-phase diffusion by means of a material adjacent to a graphene layer may be used. For example, a material containing a doping material for graphene may be used as a graphene separation layer. As the doping material, a material with which graphene can be doped and which does not relate to graphene growth is used. By using the material containing the doping material as the graphene separation layer, it is possible to cause solid-phase diffusion of the dopant from the graphene separation layer into the graphene.

Also, a material containing a doping material for graphene may be used. For the doping material, a material with which graphene can be doped and which is a catalyst for growing graphene is used. By using the material containing the doping material as a graphene separation layer, it is possible to cause solid-phase diffusion of dopant from the metallic catalyst layer into the graphene.

Further, while a catalyst underlayer as a barrier metal of a metallic catalyst layer is formed in the embodiments, a catalyst underlayer can be omitted when the diffusion from the metallic catalyst layer into a lower-layer contact does not matter. In addition, a catalyst layer does not need to be made of metal. It is desirable that a catalyst layer be conductive so that a plurality of graphene layers function as a single interconnect. However, a catalyst layer does not need to be conductive, if a graphene layer is connected only at a contact part or if a graphene separation layer is made conductive.

Figure 7A:
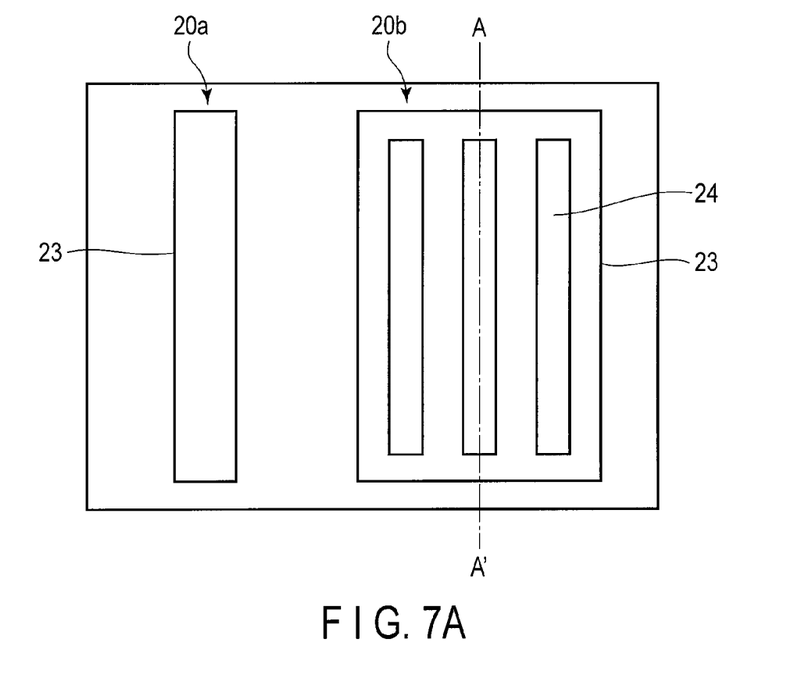
FIGS. 7A and 7B are plan and a sectional view to explain the example of the modification.
Figure 7B:
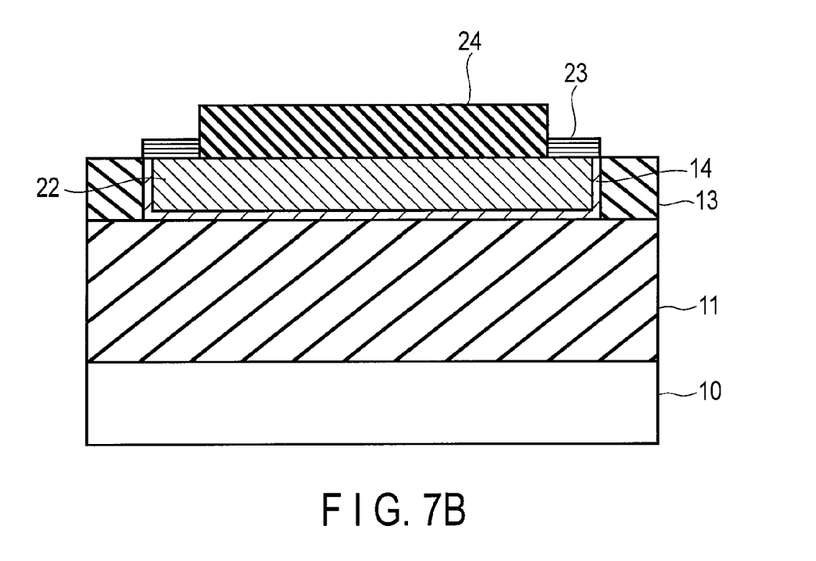

FIGS. 7A and 7B show an example where a catalyst layer is not made of metal and a graphene separation layer is not conductive. FIG. 7A is a plan view and FIG. 7B is a cross-sectional view of FIG. 7A, taken along line A-A'. In this case, it is possible to make the plurality of graphene layers 23 function as a single interconnect by connecting the plurality of graphene layers 23 at the end portion. In addition, the contact via 12 and the plurality of graphene layers 23 shown in FIG. 1 can be connected without any problem, if the plurality of graphene layers 23 contact the catalyst underlayer 21 at the end portion.

Furthermore, the element doped into the graphene layer is not always limited to Br, Cl and N; other elements can also be used. In addition, it is possible that one or more than one of these elements is doped.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a catalyst layer formed on or in a substrate along with an interconnect pattern; and
   a plurality of graphene layers formed on the catalyst layer, the plurality of graphene layers arranged in parallel in a narrower linewidth than a width of the interconnect pattern.

2. The device of claim 1, wherein
   the substrate comprises an interconnect layer insulating film arranged in an uppermost layer and a groove arranged in the insulating film; and
   the catalyst layer is embedded in the groove.

3. The device of claim 1, wherein
   the substrate comprises a contact layer insulating film arranged in an uppermost layer; and
   the catalyst layer is selectively formed on the contact layer insulating film.

4. The device of claim 1, further comprising a catalyst underlayer on or in the substrate, wherein
   the catalyst layer is formed on the catalyst underlayer.

5. The device of claim 1, wherein
the catalyst layer is formed on a whole of an interconnect region of the substrate; and
the graphene layer is selectively formed on the catalyst layer.

6. The device of claim 5, further comprising a graphene separation layer formed on the catalyst layer so that a width of an exposed portion of the catalyst layer is narrower than a width of the interconnect pattern, wherein
the graphene layer is formed on a region uncovered by the graphene separation layer of the catalyst layer.

7. The device of claim 6, wherein
the catalyst layer comprising a level difference between a portion uncovered by the graphene separation layer and a portion covered by the graphene separation layer.

8. The device of claim 1, wherein
the catalyst layer is formed in an interconnect region of the substrate to be separated into a plurality of pieces having a narrower linewidth than a width of the interconnect pattern.

9. The device of claim 1, wherein
at least one of N, Cl, Br is doped to the graphene layer.

10. A semiconductor device, comprising:
a first interconnect layer of an interconnect pattern narrower than or equal to a predetermined interconnect width arranged on a substrate, the first interconnect layer comprising a first catalyst layer formed on or in the substrate along with an interconnect pattern narrower than or equal to the predetermined interconnect width and a first graphene layer formed on the first catalyst layer; and
a second interconnect layer of an interconnect pattern wider than the predetermined interconnect width, arranged on a substrate, the second interconnect layer comprising a second catalyst layer formed on or in the substrate along with an interconnect pattern wider than the predetermined interconnect width and a plurality of second graphene layers formed on the second catalyst layer and arranged in parallel with a linewidth narrower than the predetermined interconnect width.

11. The device of claim 10, further comprising a catalyst underlayer on or in the substrate, wherein
the first and second catalyst layers are formed on the catalyst underlayer.

12. The device of claim 10, wherein
the second catalyst layer is formed on a whole of an interconnect region of the substrate; and
the plurality of second graphene layers are selectively formed on the second catalyst layer.

13. The device of claim 12, further comprising a graphene separation layer formed on the second catalyst layer so that a width of an exposed portion of the catalyst layer is narrower than the predetermined interconnect width, wherein
the plurality of second graphene layers are formed on a region uncovered by the graphene separation layer of the second catalyst layer.

14. The device of claim 10, wherein
the second catalyst layer is formed in an interconnect region of the substrate to be separated into a plurality of pieces having a narrower linewidth than the predetermined interconnect width.

15. A method of manufacturing a semiconductor device, comprising:
forming a catalyst layer formed on or in a substrate along with an interconnect pattern; and
forming a plurality of graphene layers formed in parallel on the catalyst layer in a narrower linewidth than a predetermined pattern width.

16. The method of claim 15, wherein
the forming the catalyst layer is configured to form the catalyst layer on a whole of an interconnect region of the substrate; and
the forming the graphene layers in parallel is configured to form a graphene separation layer on the catalyst layer so that a width of an exposed portion of the catalyst layer is narrower than the predetermined pattern width and then forming the graphene layers on a region uncovered by the graphene separation layer of the catalyst layer.

17. The method of claim 15, wherein
the forming the catalyst layer is configured to form the catalyst layer to be separated into a plurality of pieces having a narrower linewidth than the predetermined pattern width.

18. The method of claim 15, wherein
forming the graphene layer in parallel is configured to form the graphene layer by a CVD and adding at least one of N, Cl and Br into gas of CVD.

19. The method of claim 15, wherein
a doping material having at least one of N, Cl and Br is added to the catalyst layer in advance, and the doping material of the catalyst layer is solid-phase diffused to the graphene layers.

20. The method of claim 16, wherein
a doping material having at least one of N, Cl and Br is added to the graphene separation layer in advance, and the doping material of the graphene separation layer is solid-phase diffused to the graphene layers.

* * * * *